United States Patent [19]
Eberhardt

[11] Patent Number: 5,461,353
[45] Date of Patent: Oct. 24, 1995

[54] PRINTED CIRCUIT BOARD INDUCTOR

[75] Inventor: John E. Eberhardt, Alpharetta, Ga.

[73] Assignee: Motorola, Inc., Schaumburg, Ill.

[21] Appl. No.: 298,497

[22] Filed: Aug. 30, 1994

[51] Int. Cl.⁶ .............................. H01F 21/12; H01F 29/00
[52] U.S. Cl. .......................... 333/246; 334/56; 336/84 C; 336/200
[58] Field of Search ...................... 333/204, 205, 333/246; 334/56, 71; 336/200, 84 R, 84 C, 84 M, 144

[56] References Cited

U.S. PATENT DOCUMENTS

| | | |
|---|---|---|
| 2,910,662 | 10/1959 | Rex . |
| 3,185,947 | 5/2965 | Freymodsson . |
| 3,290,758 | 12/1966 | Moyer . |
| 3,512,254 | 5/1970 | Jenkins ........................ 29/620 |
| 3,881,244 | 5/1975 | Kendall ........................ 29/602 |
| 3,913,219 | 10/1975 | Lichtblau ...................... 29/592 |
| 3,947,934 | 4/1976 | Olson ......................... 29/25.42 |
| 4,035,695 | 6/1977 | Knutson et al. ................ 361/400 |
| 4,080,585 | 3/1978 | Molthen ....................... 336/200 |
| 4,176,445 | 12/1979 | Solow ......................... 29/620 |
| 4,369,557 | 1/1983 | Vandebult .................... 29/25.42 |
| 4,494,100 | 1/1985 | Stengel et al. ................ 336/200 |
| 4,502,025 | 2/1985 | Carl, Jr. et al. ............. 334/56 X |
| 4,536,733 | 8/1985 | Shelly ........................ 336/182 |
| 4,968,959 | 11/1990 | Leug .......................... 333/246 X |
| 4,986,160 | 1/1991 | Kemeny ........................ 336/144 X |
| 5,055,816 | 10/1991 | Altman et al. ................. 336/200 |
| 5,369,379 | 11/1994 | Fujiki ........................ 333/246 X |
| 5,373,112 | 12/1994 | Kamimura et al. ............... 336/200 X |

FOREIGN PATENT DOCUMENTS

| | | | |
|---|---|---|---|
| 59-103320 | 6/1984 | Japan . | |
| 154607 | 7/1987 | Japan ......................... | 336/84 M |
| 7405 | 1/1990 | Japan ......................... | 336/84 R |
| 771701 | 4/1957 | United Kingdom . | |

OTHER PUBLICATIONS

Askin et al., *Printed Inductor with Shooting Bars, etc.,* IBM Tech. Discl. Bulletin, vol. 28, No. 7, Dec. 1985, pp. 3194–3195.

*Primary Examiner*—Paul Gensler
*Attorney, Agent, or Firm*—Pedro P. Hernandez; Kenneth M. Massaroni

[57] ABSTRACT

A multilayer printed circuit board (100) includes a plurality of layers (101, 102, 104, 106, 108 and 110). Located within intermediate layer (106) is an inductor (200) which is shielded by top layer ground plane (202) and bottom layer ground plane (204). In another embodiment of the present invention, the inductor (200) can have its inductance adjusted by way of a inductance adjustment runner (316, 318) or by an electronic inductance adjustment device (408).

11 Claims, 4 Drawing Sheets

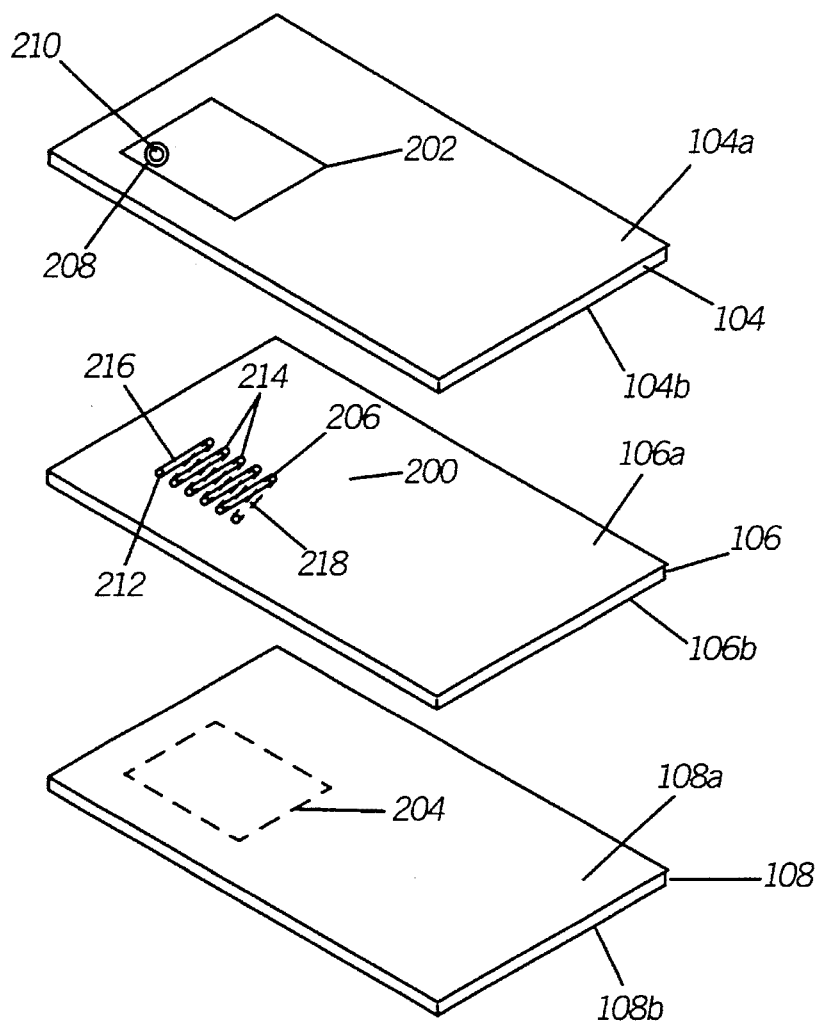
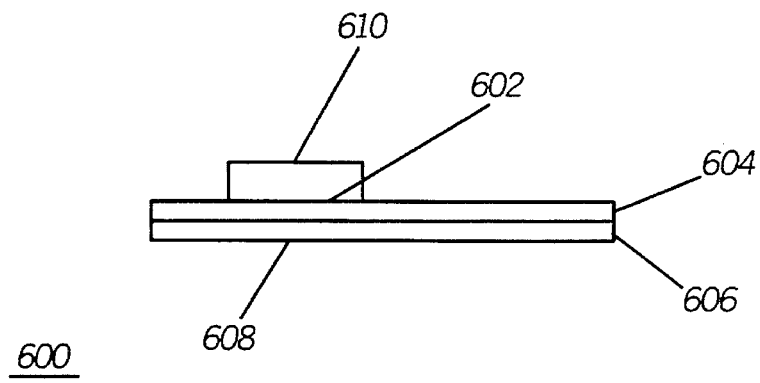

PRINTED CIRCUIT BOARD INDUCTOR

TECHNICAL FIELD

This invention relates in general to electronic assemblies, and more specifically to an inductor formed on a printed circuit board.

BACKGROUND

Electronic circuit designers must constantly address the issue of interference such as radio frequency interference (RFI) and electromagnetic interference (EMI) which affect the performance of the circuits which they design. Typical solutions to interference problems include separating circuits from one another in order to minimize interference, placing metal "cans" over sensitive circuits or circuits which are the generators of interference signals (e.g., oscillator circuits, etc.). Another problem presented when designing electronic circuits such as radio circuits is minimizing the amount of board space required to implement a given circuit. Furthermore, in the case of some circuits such as filters and transmitter circuits, it is also important to design circuits which can be tuned or adjusted in order to overcome the changes in circuits due to component tolerance variations, etc.

Cost is also a consideration. An inductor which is built into the same printed circuit board as the rest of the circuitry reduces material does not add much additional cost to the manufacturing cost of the electronic assembly. Another issue confronted by designers is component tolerances. Inductor make tolerance is a factor which influences circuit design and sometimes leads to high cost, tight tolerance inductors. A printed circuit board inductor of the type described in the present invention can be constructed inexpensively into a printed circuit board, using dimensions and spacing that conform to the circuit board manufacturers process limitations and hold tighter make tolerances than their discrete counterparts. Furthermore, there is a need in the art for an inductor which can be tunable and which can provide for improved shielding against interference.

BRIEF DESCRIPTION OF THE DRAWINGS

FIG. 2 is an exploded view of some of the intermediate layers of the multilayer circuit board shown in FIG. 1.

FIG. 6 shows another embodiment in which a printed circuit board inductor is shielded by a ground plane and a shield in accordance with the invention.

DETAILED DESCRIPTION OF THE PREFERRED EMBODIMENT

Figure 1:
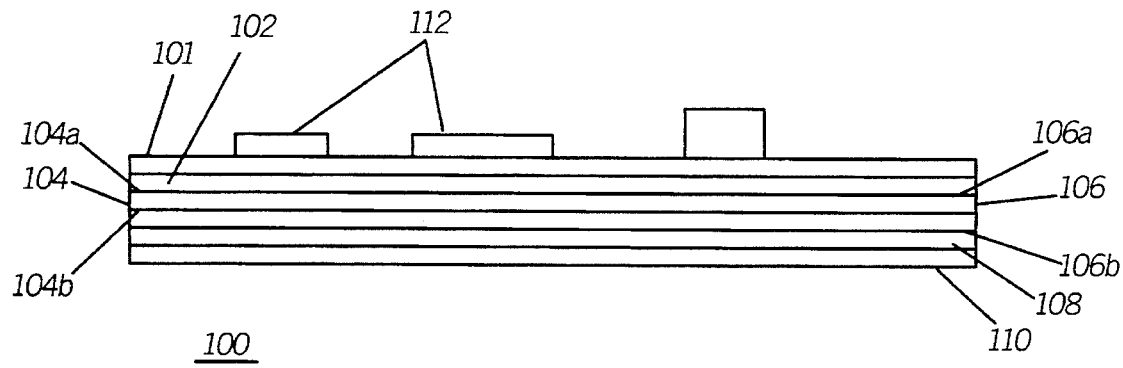
FIG. 1 is a side view of a multilayer circuit board in accordance with the invention.

While the specification concludes with claims defining the features of the invention that are regarded as novel, it is believed that the invention will be better understood from a consideration of the following description in conjunction with the drawing figures.

Referring to FIG. 1, there is shown a populated multilayer printed circuit board 100 having a printed circuit board inductor in accordance with the present invention. Multilayer circuit board 100 as shown includes 6 layers 101, 102, 104, 106, 108 and 110. Preferably, the circuit board layers are formed from a glass reinforced epoxy such as FR4, or other materials used to form printed circuit boards. The top surface of multilayer circuit board 100 is populated with a plurality of electronic components 112 as is well known in the art. Although FIG. 1 is shown as a six layer multilayer board different number of layers can be designed for depending on the particular design requirements.

In FIG. 2, an exploded view of some of the intermediate layers 104, 106 and 108 of multilayer circuit board 100 are shown. In accordance with the invention, a printed circuit inductor 200 is formed on layer 106. Inductor 200 is formed by interconnecting metallization patterns 216 located on first surface 106a with metallization patterns 218 located on second surface 106B using interconnection vias 214. The vias could be blind or buried, as would be the case for a sequentially laminated circuit board, or the vias could penetrate each layer of the circuit board as will be discussed in reference to FIG. 5. Inductor 200 as shown forms a multi-turn inductor having first 212 and second 206 terminals. In accordance with one embodiment of the present invention, the inductor 200 is shielded against external interference by ground planes 202 and 204 which are located so as to be in alignment or registration with inductor 200 when layers 104, 106 and 108 are mated together. When layers 101–110 are laminated together to form the multilayer board, ground planes 202 and 204 substantially overlay inductor 200, thereby providing interference protection to the inductor.

Ground plane 202 is formed by a metallization pattern located on first or top surface 104A of layer 104. Ground plane 204 is formed on the bottom or second surface 108B of layer 108. Metallization patterns 202 and 204 are electrically coupled to the multilayer circuit's ground potential using conventional runners (traces) and via interconnection techniques. In order to interconnect inductor 200 with other electronic components 112 located on multilayer board 100 one or both terminals 212 and 206 are interconnected to other layers of circuit board 100 using metallized vias. For example, terminal 212 can be electrically coupled to one of the upper layers 101 or 102 of circuit board 100 by providing a metallized via 210 in order to interconnect via 212 through layer 104 and up to a predetermined point on layer 101 or 102. In order to avoid short circuiting via 210 to ground plane 202, a non-metallized area 208 is provided between via 210 and ground plane 202. Preferably, the interconnection vias 210 used to interconnect the inductor 200 located in the intermediate layers of circuit board 100 are kept as short as possible in order to minimize effecting the inductance value of inductor 200 as well as prevent interference signals from effecting the circuit.

Although ground planes 202 and 204 reduce the inductance value of inductor 200 slightly, this change in inductance due to the shield can be compensated for by adjusting the dimensions of inductor 200. For example, the metallization runners 216, 218 can be decreased in width, the size of vias 214 can be decreased in size, more turn(s) can be added to the inductor, etc. Ground planes 202 although shown as not taking up the entire surface of the intermediate layers they reside on, could take substantially the entire surface of their corresponding layers if needed to improve shielding.

The overall area taken up to form inductor 200 is dictated by the required inductance, the amount of current that the inductor will carry, the required Q (quality factor) of the inductor, and the minimum feature size available from the PCB vendor. A typical four turn coil would require an area of approximately 2.413 millimeter by 1.016 millimeter using conventional printed circuit manufacturing techniques, although smaller footprints can be achieved using more expensive printed circuit board manufacturing techniques.

Figure 5:
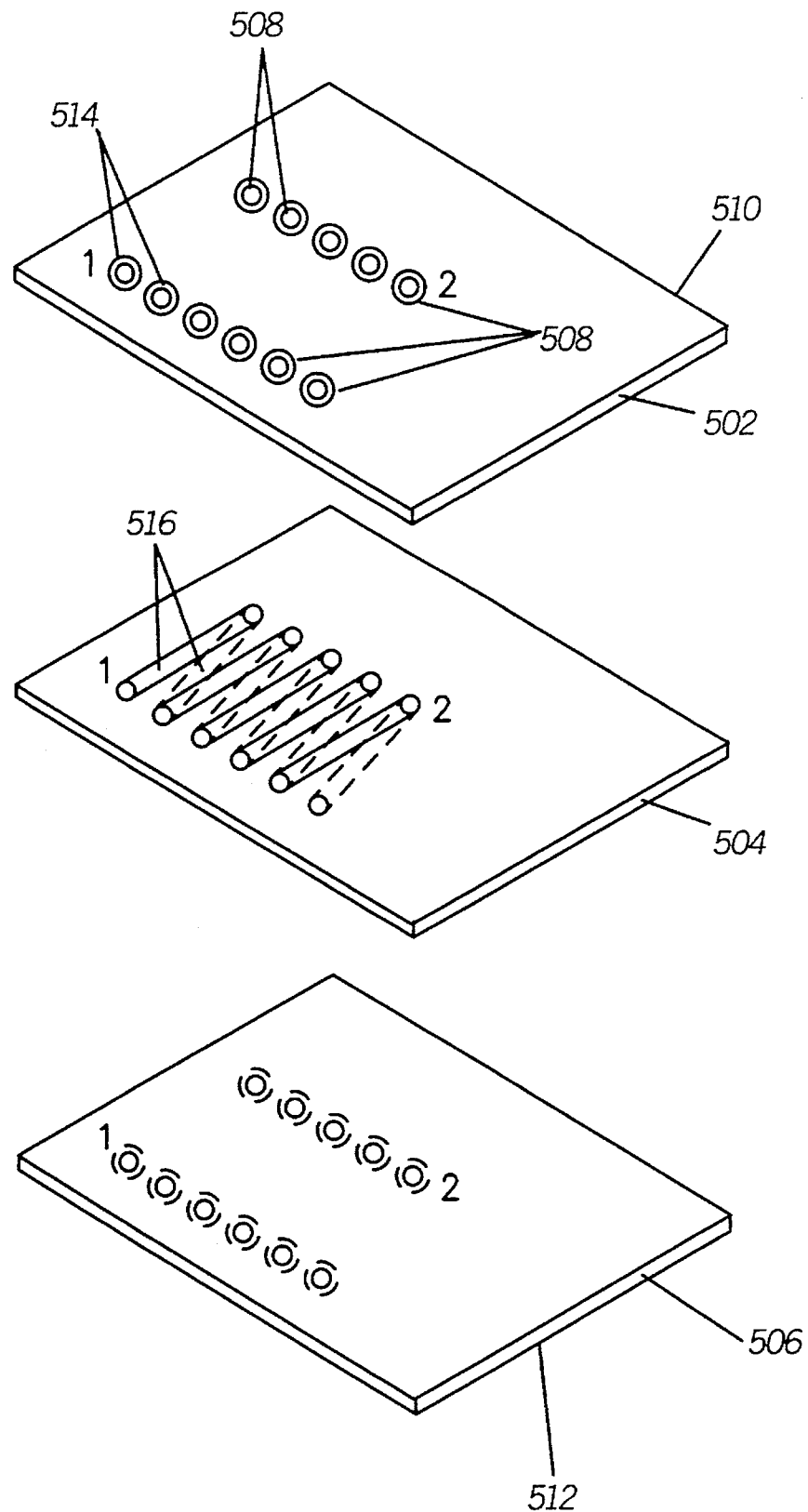
FIG. 5 shows an exploded view of similar intermediate layers as shown in FIG. 2, in this case using standard board construction techniques.

In order to save manufacturing costs, instead of using blind vias as shown in FIG. 2 which cost more to manufacture, standard board construction can be used to manufacture the multilayer circuit board as shown in FIG. 5 in order to save costs. In FIG. 5, all the vias 508 shown go through all the layers of the multilayer circuit board including the intermediate layers 502, 504 and 506. In the case of ground plane layers 502 and 504, the vias are electrically isolated from the ground planes 510 and 512 by areas which surround each via 508 which are not plated. Ground plane 510 is located on the top surface of layer 502, while ground plane 512 is located on the bottom surface of layer 506 in order to isolate the ground planes from the traces 516.

Figure 7:
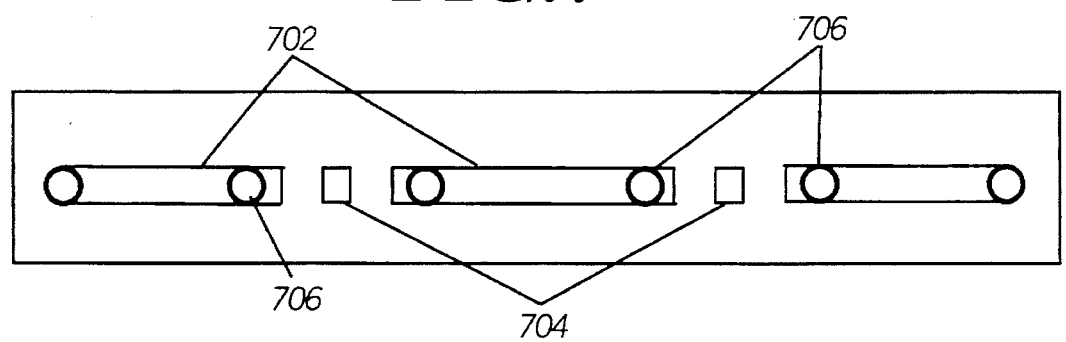
FIGS. 7–9 show different printed circuit board inductors in accordance with the invention.
Figure 8:
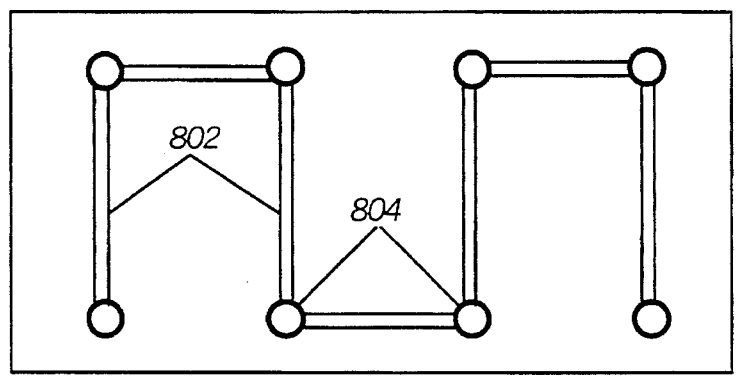
Figure 9:
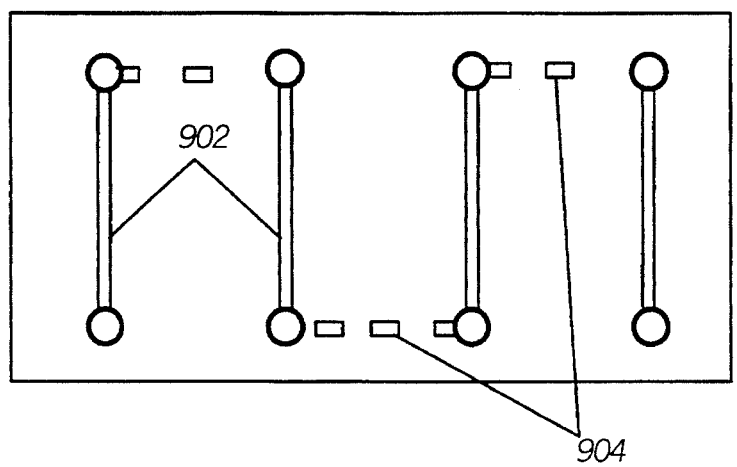

Although the inductor 200 shown in FIG. 2 has been shown as an equivalent of air wound coil having the printed circuit board as the dielectric, other forms of printed circuit inductors can work with the present invention. Such as, inductors which are formed on one surface of the printed circuit board using no vias, other inductors which use two or more major surfaces of substrates to form, inductors which are straight lines or have other shapes, etc. In FIGS. 7–9 some other different printed circuit board inductors which can be used with the present invention are shown. FIG. 7 shows a straight line inductor having traces 702 on top surface and trace portions 704 on the bottom surface which are interconnected by vias 706. In FIG. 8, a single surface winding inductor which is formed by trace sections 802 which are interconnected by serial connecting vias 804 is shown. In FIG. 9, a dual surface inductor is shown having section 902 on the top surface and trace sections 904 on the bottom surface. Other types of inductor shapes and designs other than those shown can also be utilized.

Figure 3:
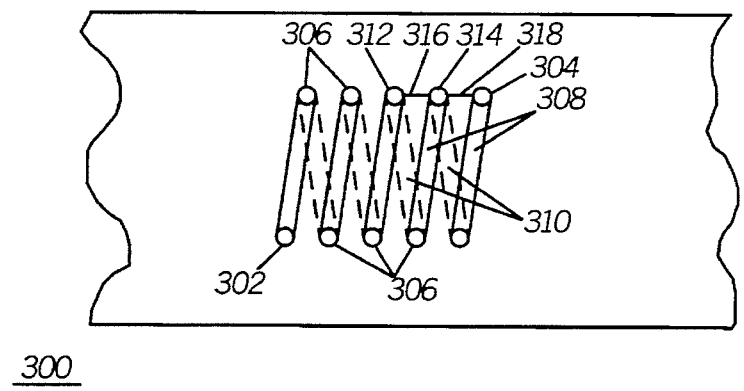
FIG. 3 shows a tunable planar inductor having inductance adjustment means in accordance with the invention.

When manufacturing electronic circuit boards, such as radio frequency circuits, it is sometimes required to tune the circuits during the manufacturing process. This is typically caused by component tolerance differences found between circuit boards due to variations between electronic components. In FIG. 3, a tunable printed circuit inductor 300 in accordance with another embodiment of the invention is shown. Inductor 300 includes a plurality of interconnection vias 306 which electrically interconnect top runners 308 with bottom runners 310. Inductor 300 includes two end terminals 302 and 304. In this embodiment, inductor 300 includes one or more inductance adjustment means which can take the form of metallized runners or trimmable resistors 316 and 318. Inductance adjustment runners 316 and 318 are metallized runners which short some of the turns of inductor 300. In order to increase the inductance value of inductor 300, one or more of the adjustment runners 316 are cut using well known laser trimming equipment or by simply mechanically cutting one or both runners 316, 318. Instead of metallized runners, laser trimmable resistors as known in the art having appropriate resistance values can be used, and trimmed in order to adjust the inductance value of inductor 200.

As shown in FIG. 3, with both inductance adjustment runners in place, inductor 300 forms a 2½ turn coil with its terminals being 302 and 312. If runner 316 is cut, the inductor becomes a 3½ turn coil with its terminals being 302 and 314. Finally, if both of the inductance adjustment runners 316 and 318 are cut, the inductor becomes a 4½ turn coil, with terminals 302 and 304. Inductor 300 could be used for example, in a radio transmitter circuit wherein the power output of the transmitter could be adjusted during manufacture by trimming one or more of the inductance adjustment runners. If the vias 312, 314, and 304 where spaced appropriately, the runners 316 and 318 could be replaced with resistors, or zero ohm jumpers if desired, to decrease the inductance again.

Figure 4:
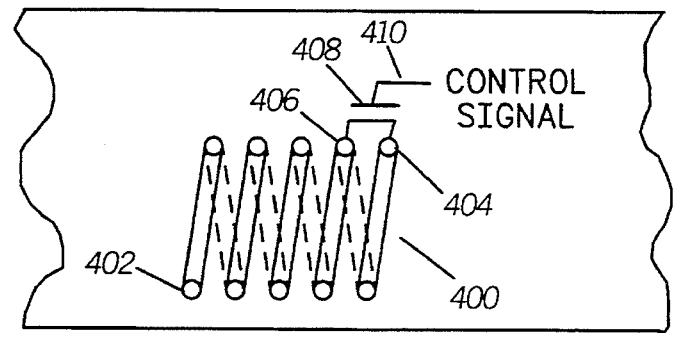
FIG. 4 shows a tunable planar inductor having an electronically adjustable inductance in accordance with the invention.

FIG. 4 shows a tunable inductor or coil 400 having an electronically adjustable inductance value in accordance with the invention. Instead of using metallized runners 316 and 318 as shown in FIG. 3 in order to adjust the inductance value, in FIG. 4, a transistor 408 such as a field-effect transistor (FET), bipolar junction transistor (BJT) or other type of appropriate transistor as known in the art is used to automatically switch the inductance value of inductor 400. Transistor 408 is located between two adjacent turns of the printed circuit inductor 400. Transistor 408 is either in a first state where vias 406 and 404 are shorted together or in a second state where the transistor is open and there is no direct connection between vias 406 and 404. In the first state inductor 400 acts as a 3½ turn coil, while when transistor 408 is in the second state coil 400 acts as a 4½ turn coil.

Transistor 408 is switched from the first state to the second state by a control signal sent via line 410. The control signal can be generated by a number of conventional hardware circuits such as a microprocessor or other type of hardware circuit. Electronically tunable coil 400 provides the ability of adjusting the inductance value of inductor 400 even when inductor 400 is formed within intermediate layers of a multilayer circuit board as shown in FIG. 1. This provides the opportunity of having an inductor located within a multilayer circuit board as discussed with reference to FIG. 1 and still be able to adjust its inductance value. Electronically tunable inductor 400 can be used for many electronic circuits where a tunable inductor is required. For example, in radio transmitter circuits in order to adjust the power output level, etc.

In FIG. 6, another embodiment of the present invention in which a printed circuit board inductor 602 is shielded by a ground plane 608 and a shield 610 is shown. In this embodiment, a printed circuit board inductor is formed on substrate 604 similar to that shown in FIG. 2. A second substrate 606 having a ground plane 608 etched on the bottom layer is attached to the first substrate 604. And a shield such as a metal can 610 is attached to the top layer of substrate 604 in order to fully shield inductor 602 from interference. Inductor 602 can include the inductance tuning means previously discussed if tuning is a requirement.

In summary, the present invention provides for a shielded planar inductor which can be used in environments were a shielded inductor is required, such as in radio frequency circuit applications. By locating the inductor within the intermediate layers of a multi-layer circuit board, board space on the top surface of the multi-layer circuit board is conserved for other electronic components. In another aspect of the present invention, a planar printed circuit board inductor 300 or 400 includes an inductance tuning means such as metallized runners 316, 318, an electronic switching device 408, or other means in order to adjust the inductance value. The electronically tunable inductor shown in FIG. 4 can also be formed within intermediate layers of a multilayer circuit board in order to conserve board space and also to allow the inductor to be shielded if required.

What is claimed is:

1. An electronic assembly, comprising:

a multilayer circuit board including first and second substrate layers each having first and second major surfaces;

an inductor formed on the second substrate layer;

a first ground plane located on the first major surface of the first substrate layer;

the second major surface of the first substrate layer is attached to the first major surface of the second substrate layer such that the first ground plane is located in substantial registration with the inductor;

an electronic switch operable between first and second states and coupled between two of the metallization vias such that the inductor has a first inductance value when the electronic switch is in the first state and a second inductance value when the electronic switch is in the second state; and wherein the second substrate layer has first and second major surfaces and the inductor includes a series of metallization runners on the first and second major surfaces which are serial interconnected with each other through the second intermediate layer by a plurality of metallized vias.

2. An electronic assembly as defined in claim 1, further comprising a third intermediate substrate layer having first and second major surfaces;

a second ground plane located on the second major surface of the third substrate layer; and the first major surface of the third substrate layer is attached to the second major surface of the second substrate layer and the second ground plane is in substantial registration with the first ground plane and the inductor.

3. An electronic assembly as defined in claim 1, wherein substrate layers are formed from glass reinforced epoxy.

4. An electronic assembly as defined in claim 1, further comprising a runner electrically coupling two of the metallization vias together such that at least one of the serially connected metallization runners is electrically bypassed so as to lower the inductance value of the inductor.

5. An assembly, comprising:

a first substrate;

an inductor formed on the first substrate, the inductor including a series of metallization runners which are serial interconnected with each other by a plurality of metallized vias; and an inductance adjustment means coupled between two of said plurality of metallized vias, wherein the inductance adjustment means comprises a transistor which can switch between first and second states, and when in the first state the inductance value of the inductor is a first value and when in the second state the inductance value of the inductor is a second value.

6. An assembly as defined in claim 5, wherein the inductance adjustment means comprises a metallized runner.

7. An assembly as defined in claim 5, wherein the inductance adjustment means comprises a trimmable resistor.

8. An assembly as defined in claim 5, further comprising:

a second substrate;

a ground plane located on the second substrate; and the first and second substrate are attached to each other.

9. An assembly as defined in claim 8, wherein the ground plane substantially overlays the inductor.

10. A multilayer printed circuit board assembly comprising:

a first printed circuit board layer having an inductor formed on the printed circuit board layer;

a second printed circuit board layer attached to the first printed circuit board layer having a ground plane which substantially overlays the inductor; and an electronic switch operable between first and second states and such that the inductor has a first inductance value when the electronic switch is in the first state and a second inductance value when the electronic switch is in the second state.

11. A multilayer printed circuit board assembly as defined in claim 10, further comprising:

a shield attached to the first printed circuit board layer such that the shield and ground plane sandwich the inductor between them.

* * * * *